United States Patent
Shih

(10) Patent No.: US 8,319,355 B2
(45) Date of Patent: Nov. 27, 2012

(54) LIGHT EMITTING DEVICE

(75) Inventor: Hung-Hsin Shih, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/960,454

(22) Filed: Dec. 3, 2010

(65) Prior Publication Data

US 2012/0119247 A1 May 17, 2012

(30) Foreign Application Priority Data

Nov. 16, 2010 (TW) ................................ 99139384 A

(51) Int. Cl.
*H01L 33/56* (2010.01)

(52) U.S. Cl. ........ 257/789; 257/100; 257/790; 257/795; 257/E33.058; 257/E51.02; 445/25

(58) Field of Classification Search ................... 257/789
See application file for complete search history.

(56) References Cited

U.S. PATENT DOCUMENTS

| | | | |
|---|---|---|---|
| 6,998,776 B2 | 2/2006 | Aitken et al. | |
| 7,407,423 B2 | 8/2008 | Aitken et al. | |
| 7,425,166 B2 | 9/2008 | Burt et al. | |
| 7,595,854 B2 | 9/2009 | Sung et al. | |
| 7,602,121 B2 | 10/2009 | Aitken et al. | |
| 7,652,305 B2 | 1/2010 | Chatterjee et al. | |
| 2003/0066311 A1 | 4/2003 | Li et al. | |
| 2007/0090759 A1* | 4/2007 | Choi et al. | 313/512 |
| 2007/0170423 A1* | 7/2007 | Choi et al. | 257/40 |
| 2007/0170605 A1* | 7/2007 | Lee et al. | 264/1.1 |
| 2007/0170839 A1* | 7/2007 | Choi et al. | 313/500 |
| 2007/0172971 A1* | 7/2007 | Boroson | 438/26 |
| 2008/0122118 A1* | 5/2008 | Basheer et al. | 257/778 |
| 2008/0239637 A1 | 10/2008 | Sung et al. | |
| 2009/0064717 A1* | 3/2009 | Son et al. | 65/42 |
| 2009/0065049 A1* | 3/2009 | Son et al. | 136/256 |
| 2010/0244057 A1* | 9/2010 | Ryu et al. | 257/88 |

FOREIGN PATENT DOCUMENTS

CN 101009305 A 8/2007

\* cited by examiner

*Primary Examiner* — Calvin Lee
*Assistant Examiner* — Abul Kalam
(74) *Attorney, Agent, or Firm* — CKC & Partners Co., Ltd.

(57) ABSTRACT

Disclosed herein is a light emitting device, which includes a first substrate, a protective layer, a second substrate, a buffer member and a sealant. The first substrate has an illuminating member thereon. The protective layer covers the illuminating member and has a first coefficient of thermal expansion. The second substrate is disposed over the protective layer. The buffer member is disposed between the first and second substrates and surrounds the protective layer, wherein the buffer member has a second coefficient of thermal expansion which is less than the first coefficient. The sealant surrounds the buffer member and seals off the space between the first and second substrates, wherein the sealant has a third coefficient of thermal expansion which is less than the second coefficient.

18 Claims, 3 Drawing Sheets

LIGHT EMITTING DEVICE

RELATED APPLICATIONS

This application claims priority to Taiwan Application Serial Number 099139384, filed Nov. 16, 2010, which is herein incorporated by reference.

BACKGROUND

1. Field of Invention

The present invention relates to a light emitting device.

2. Description of Related Art

Light emitting devices have gained much research attention in recent years. The organic light emitting diode (OLED) is of particular interest because of their wide application in discrete lights and display devices.

OLED devices are advantageous in high brightness and contrast ratio and also wide viewing angle. An OLED is a light-emitting diode (LED) in which the emissive electroluminescent layer is a film of organic compounds that emits light when an electric current passes through it. This layer of organic semiconductor material is formed between two electrodes.

Conventional OLED devices have problems in the deterioration of the organic layer and the electrode. The organic layer and the electrode of the OLED devices are sensitive to and react with oxygen and moisture, and thereby degrade the performance of OLED devices. If both the electrode and organic layer may be completely sealed in the OLED device and therefore prevents oxygen and moisture from leakage into the device, the effective lifetime of OLED devices can be significantly increased. However, it is very difficult to develop a sealing process to completely seal the OLED device.

In view of the above, there exists in this art a need of an improved OLED device that would resolve the above-mentioned issue.

SUMMARY

A light emitting device is provided. The light emitting device comprises a first substrate, a protective layer, a second substrate, a buffer member and a sealant. The first substrate has an illuminating member thereon. The protective layer covers the illuminating member and has a first coefficient of thermal expansion. The second substrate is disposed over the protective layer. The buffer member is disposed between the first and second substrates and surrounds the protective layer, wherein the buffer member has a second coefficient of thermal expansion which is less than the first coefficient. The sealant surrounds the buffer member and seals off the space between the first and second substrates, wherein the sealant has a third coefficient of thermal expansion which is less than the second coefficient.

In one embodiment, the first CTE ranges from about $70 \times 10^{-6}$/K to about $300 \times 10^{-6}$/K, the second CTE ranges from about $1 \times 10^{-6}$/K to about $300 \times 10^{-6}$/K, and the third CTE ranges from about $1 \times 10^{-6}$/K to about $10 \times 10^{-6}$/K.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
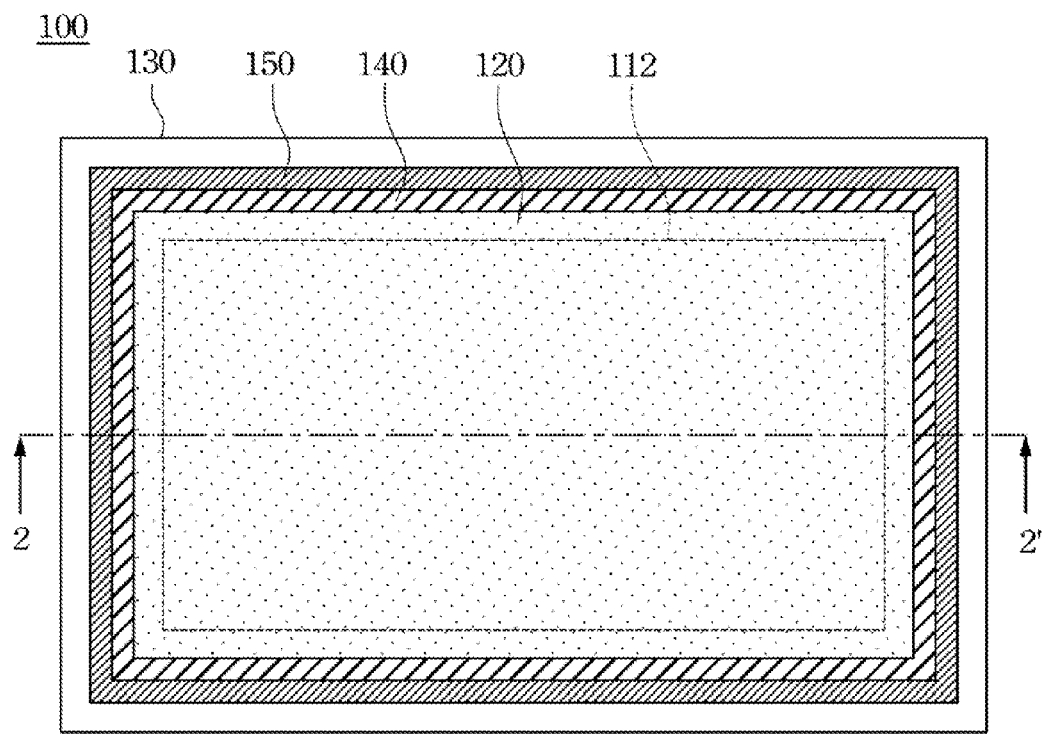
FIG. 1 is a top view schematically illustrating a light emitting device according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 2:
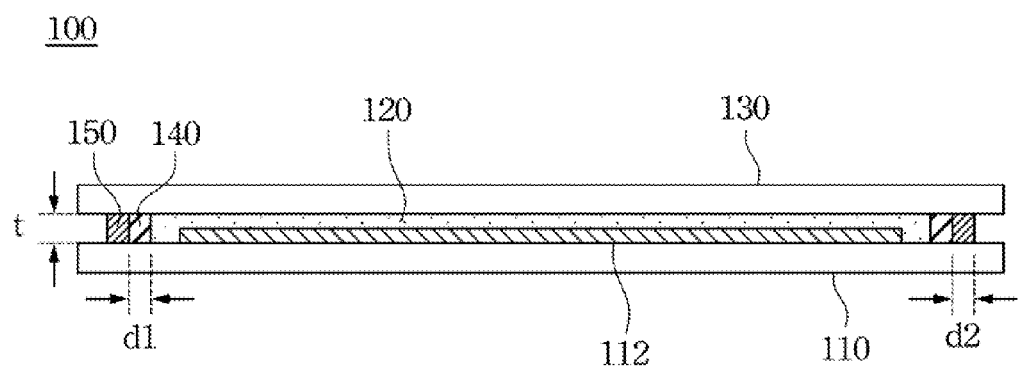
FIG. 2 is a cross-sectional view taking along line 2-2' in FIG. 1.

FIG. 1 is a top view schematically illustrating a light emitting device 100 according to one embodiment of the present disclosure. FIG. 2 is a cross-sectional view taken along line 2-2' in FIG. 1. Referring to FIG. 1 and FIG. 2, the light emitting device 100 includes a first substrate 110, a protective layer 120, a second substrate 130, a buffer member 140, and a sealant 150.

The first substrate 110 has an illuminating member 112 disposed thereon. The first substrate 110, for example, may be an insulating substrate which is made of glass, quartz, ceramic or plastic. In some embodiments, the illuminating member 112 may comprise an organic light emitting element, a polymeric light emitting element or a phosphor layer. In one example, the light emitting device 100 is an organic light emitting device display, and the illuminating member 112 includes an array of organic light emitting elements (not shown).

The protective layer 120 covers the illuminating member 112 and has a first coefficient of thermal expansion (CTE). The protective layer 120 is provided to protect the illuminating member 112 from being damaged or contaminated. The protective layer 120 may prevent moisture and oxygen from penetrating into the illuminating member 112, especially prior to the illuminating member 112 being encapsulated by the second substrate 130 and the sealant 150. The protective layer 120 comprises an acrylic resin or an epoxy resin, which exhibits a desired resistance to moisture and oxygen. In one example, the area of the protective layer 120 may be larger than that of the illuminating member 112 so as to fully cover the entire illuminating member 112, as depicted in FIG. 2. In some examples, the first CTE of the protective layer 120 may range from about $70 \times 10^{-6}$/K to about $300 \times 10^{-6}$/K, for example, about $147 \times 10^{-6}$/K. In addition, the protective layer 120 may be formed by any method known in the art. For example, a coating method, a dispensing method or a screen printing method may be employed to form the protective layer 120. In the case where the acrylic resin or epoxy resin is used as the protective layer 120, either a thermal curing or an ultraviolet (UV) light curing process may be utilized.

The second substrate 130 is disposed over the protective layer 120. Specifically, the second substrate 130 covers the protective layer 120, and both the illuminating member 112 and the protective layer 120 are sandwiched between the first and the second substrates 110, 130. In one embodiment, the dimension of the second substrate 130 may be substantially equal to or smaller than the first substrate 110. However, the second substrate 130 has an area larger than the protective layer 120. The material of the second substrate 130 may be the same as or different from the first substrate 110.

The buffer member 140 surrounds the protective layer 120, and is disposed between the first substrates 110 and second substrates 130. In one embodiment, the buffer member 140 is formed on the first substrate 110, and adjoins to the second substrate 130, as depicted in FIG. 2. In particular, the buffer member 140 seals off the space between the first and second substrates 110, 130. In another embodiment, the buffer member 140 is in direct contact with the protective layer 120 and the sealant 150. In some examples, the width "d1" of the buffer member 140 ranges from about 100 μm to about 500 μm, and the thickness "t1" of the buffer member 140 is about 8 μm to about 30 μm.

The buffer member 140 has a second CTE which is less than the first CTE of the protective layer 120. In some embodiments, the second CTE may range from about $1\times10^{-6}$/K to about $300\times10^{-6}$/K, specifically about $30\times10^{-6}$/K to about $110\times10^{-6}$/K. In one example, the second CTE of the buffer member 140 may be about $70\times10^{-6}$/K.

In one embodiment, the buffer member 140 may comprise a polymeric resin and a plurality of inorganic oxide particles dispersed in the polymeric resin. In some examples, the polymeric resin may comprise an acrylic resin, an epoxy resin or a combination thereof. The inorganic oxide may be silicon dioxide ($SiO_2$), titanium dioxide ($TiO_2$), zinc oxide (ZnO), zirconium dioxide ($ZrO_2$), ferrite oxide ($Fe_2O_3$), antimony oxide ($Sb_2O_3$), phosphorous oxide ($P_2O_5$), aluminum oxide ($Al_2O_3$), boron oxide ($B_2O_3$), tungsten oxide ($WO_3$), magnesium oxide (MgO), bismuth oxide ($Bi_2O_3$), vanadium oxide ($V_2O_5$), calcium oxide (CaO), barium oxide (BaO), lithium oxide ($Li_2O$), sodium oxide ($Na_2O$), potassium oxide ($K_2O$), tellurium oxide ($TeO_2$), lead oxide (PbO), tin oxide (SnO), ruthenium oxide ($Ru_2O$), rubidium oxide ($Rb_2O$), rhodium oxide ($Rh_2O$) or copper oxide (CuO). The particle size of the inorganic oxide particle may be about 10 nm to about 500 nm, more specifically, about 10 nm to about 100 nm. In one embodiment, the polymeric resin may exist at a concentration of about 20% to about 80% by weight of the buffer member 140, specifically about 40% to about 80%. Furthermore, the concentration of the inorganic oxide particles may be about 20% to about 80% by weight of the buffer member 140, specifically about 20% to about 60%. In one example, the buffer member 140 is substantially composed of about 40 wt % of polymeric resin and about 60 wt % of inorganic oxide particles. In another embodiment, the buffer member 140 may further comprise additives such as photo initiators, and the concentration of the additives may be in the range of about 0.1% to about 5%, based on the weight of the buffer member 140.

Figure 3:
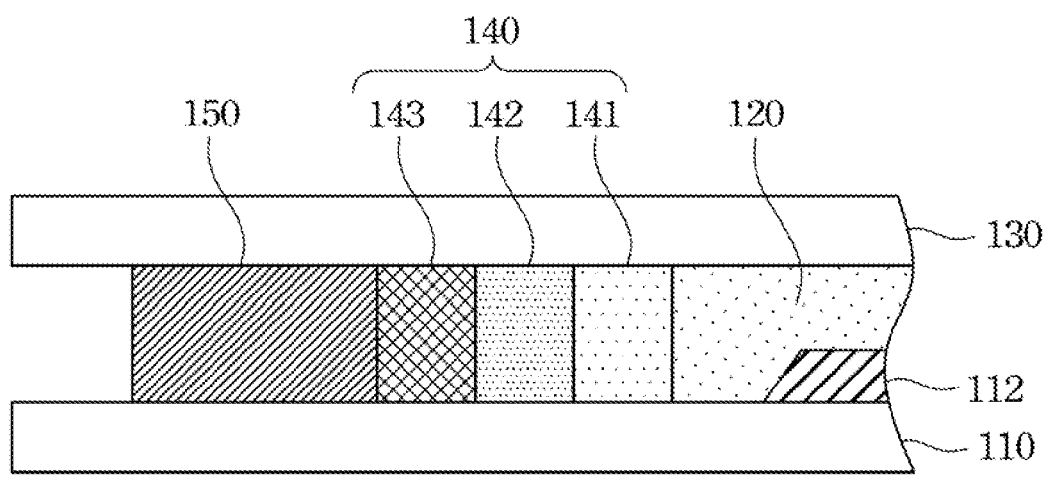
FIG. 3 is a cross-sectional view schematically illustrating a light emitting device according to another embodiment of the present disclosure.

In another embodiment, the buffer member 140 includes a first sub-buffer 141, a second sub-buffer 142 and a third sub-buffer 143, as depicted in FIG. 3. The concentration of the inorganic oxide particle of the third sub-buffer 143 is greater than that of the second sub-buffer 142. Further, the concentration of the inorganic oxide particle of the second sub-buffer 142 is greater than that of the first sub-buffer 141. In other words, the concentration of the inorganic oxide particle of the buffer member 140 has a maximum value at a position adjacent to the sealant 150 whereas a minimum value presented at a position adjacent to the protective layer 120. For instance, the first sub-buffer 141 is composed of about 80 wt % of the polymeric resin and about 20 wt % of the inorganic oxide particles. The second sub-buffer 142 is composed of about 50 wt % of polymeric resin and about 50 wt % of the inorganic oxide particles. Further, the third sub-buffer 143 is composed of about 20 wt % of the polymeric resin and about 80 wt % of the inorganic oxide particles. In this embodiment, the CTE of the first sub-buffer 141 is greater than that of the second sub-buffer 142, and the CTE of the second sub-buffer 142 is greater than that of the third sub-buffer 143. Specifically, the CIEs of the first, second and third sub-buffers 141, 142,143 respectively are about $110\times10^{-6}$/K, about $75\times10^{-6}$/K and about $30\times10^{-6}$/K. In view of the above, the second CTE of the buffer member 140 has a maximum value at an end portion adjacent to the protective layer 120 whereas a minimum value presented at the other end portion adjacent to the sealant 150.

Figure 4:
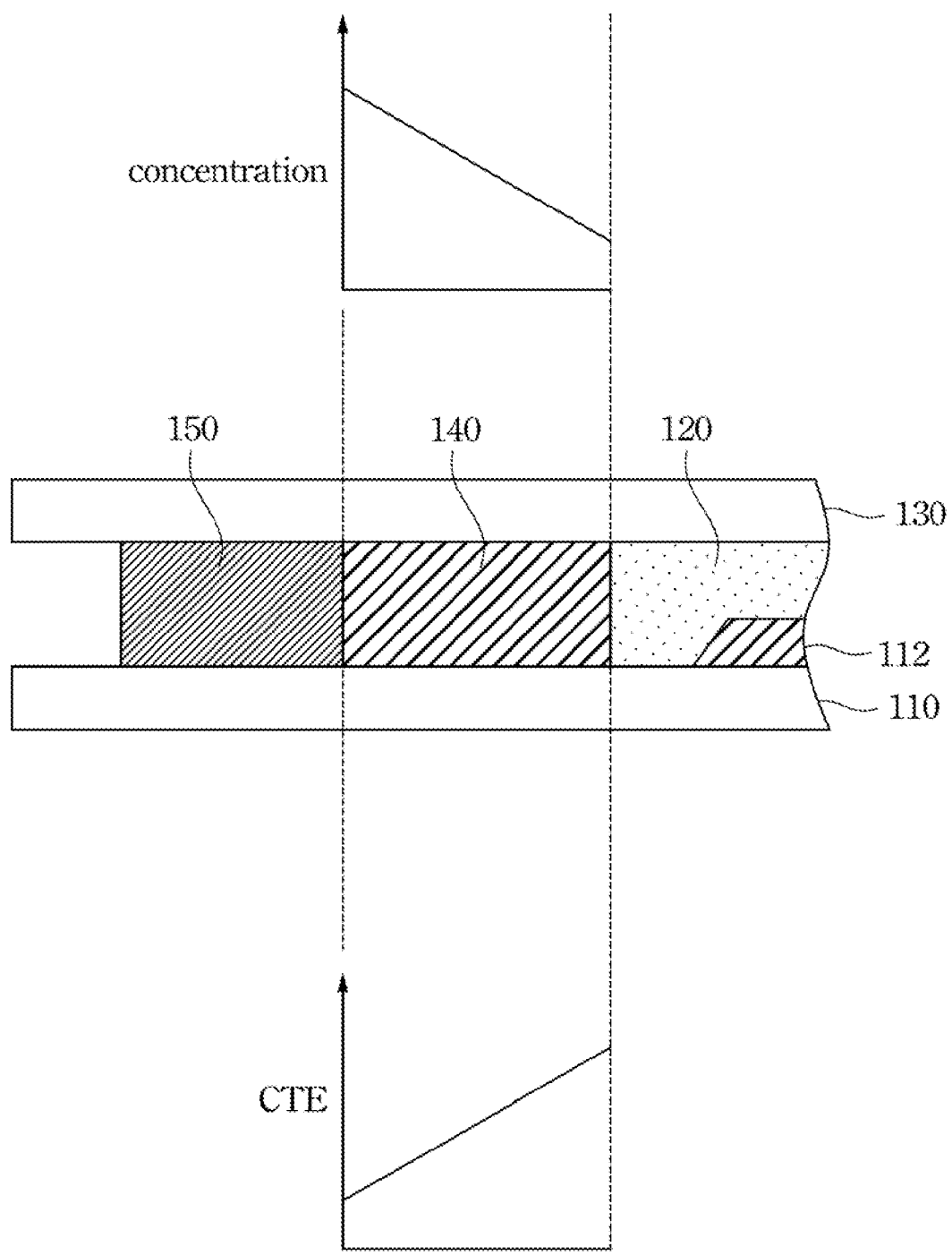
FIG. 4 is a cross-sectional view schematically illustrating a light emitting device according to another embodiment of the present disclosure.

In still another embodiment, the concentration of the inorganic oxide particle of the buffer member 140 may gradually increase with a distance from an interface between the protective layer 120 and the buffer member 140, as depicted in FIG. 4. In other words, the concentration of the inorganic oxide particle has a maximum value at an end position in contact with the sealant 150. In this embodiment, the second CTE of the buffer member 140 decreases with the distance from the interface between the protective layer 120 and the buffer member 140. Particularly, the second CTE of the buffer member 140 exhibits a maximum value at a position adjacent to the protective layer 120 whereas a minimum value presents at a position adjacent to the sealant 150.

The sealant 150 surrounds the buffer member 140 and is disposed between the first and second substrates 110, 130. The sealant 150 is operable to bond the first and second substrates 110, 130 together and seal off the space there between, as depicted in FIG. 2. In one embodiment, the sealant 150 may directly contact the buffer member 140. The width "d2" of the sealant 150 may range from about 500 μm to about 1 mm, and the thickness of the sealant 150 may be about 8 μm to about 30 μm. In one example, the thickness of the sealant 150 is the same as the buffer member 140.

The sealant 150 has a third CTE that is less than the second CTE of the buffer member 140. In one embodiment, the third CTE may range from about $1\times10^{-6}$/K to about $10\times10^{-6}$/K, specifically about $2\times10^{-6}$/K to about $6\times10^{-6}$/K.

In one embodiment, the sealant 150 may be made from a glass frit. Suitable materials for the glass frit include, but are not limited to, silicon dioxide ($SiO_2$), titanium dioxide ($TiO_2$), zinc oxide (ZnO), zirconium dioxide ($ZrO_2$), ferrite oxide ($Fe_2O_3$), antimony oxide ($Sb_2O_3$), phosphorous oxide ($P_2O_5$), aluminum oxide ($Al_2O_3$), boron oxide ($B_2O_3$), tungsten oxide ($WO_3$), magnesium oxide (MgO), bismuth oxide ($Bi_2O_3$), vanadium oxide ($V_2O_5$), calcium oxide (CaO), barium oxide (BaO), lithium oxide ($Li_2O$), sodium oxide ($Na_2O$), potassium oxide ($K_2O$), tellurium oxide ($TeO_2$), lead oxide (PbO), tin oxide (SnO), ruthenium oxide ($Ru_2O$), rubidium oxide ($Rb_2O$), rhodium oxide ($Rh_2O$), copper oxide (CuO) and a combination thereof.

Typically, the sealant 150 is formed by the following process. Briefly, a frit paste (or slurry) is coated on the first substrate 110, which has formed thereon with the illuminating member 112, the protective layer 120 and the buffer member 140, and followed by a drying process. Sequentially, the second substrate 130 is aligned and positioned onto the first substrate 110 having the dried frit paste. And then, a sintering process or laser beam may be applied to cure the frit paste, and thus forming the sealant 150. While a laser beam is employed, it is also known as "laser sealing". The sealant 150 is capable of bonding the first and second substrates 110, 130 together and sealing off the space there between.

The frit paste (or slurry), for example, may comprise a number of glass frit particles, a solvent and an organic binder. The particle size of the glass frit may be about 1 μm to about 30 μm, more specifically about 1 μm to about 5 μm. The glass frit may has a concentration of about 5% to about 40% by weight of the frit paste, specifically about 10% to about 30%. The concentration of the organic binder may be about 5% to about 40% by weight of frit paste, for example about 10% to about 30%. Furthermore, the content of the solvent(s) may be about 50 wt % to about 90 wt %, specifically about 70% to about 90%. In one example, the sealant 150 is substantially composed of about 15 wt % of the organic binder, about 15 wt % of the glass frit particles and about 70 wt % of the solvent(s).

The protective layer 120 disclosed herein may prevent moisture and oxygen from penetrating into the illuminating member 112. However, the edge of the protective layer in the conventional art has a problem of crack or peel during the laser sealing and sintering processed. The present disclosure discovers that this problem may be resolved by interposing a buffer member 140 between the protective layer 120 and the sealant 150, in which the CTE of the buffer member 140 is between those of the protective layer 120 and the sealant 150.

While the foregoing is directed to embodiments of the present invention, other and further embodiments of the invention may be devised without departing from the basic scope thereof, and the scope thereof is determined by the claims that follow.

What is claimed is:

1. A light emitting device, comprising:
   a first substrate having an illuminating member thereon;
   a protective layer covering the illuminating member and having a first coefficient of thermal expansion;
   a second substrate disposed over the protective layer;
   a buffer member disposed between the first and second substrates and surrounding the protective layer, wherein the buffer member has a second coefficient of thermal expansion which is less than the first coefficient, wherein the buffer member comprises a polymeric resin and a plurality of inorganic oxide particles dispersed in the polymeric resin, wherein the inorganic oxide particles has a concentration of about 20% to about 80% by weight of the buffer member; and
   a sealant disposed between the first and second substrates and surrounding the buffer member, wherein the sealant has a third coefficient of thermal expansion which is less than the second coefficient, wherein the concentration of the inorganic oxide particle has a maximum value at an end position in contact with the sealant.

2. The light emitting device of claim 1, wherein the buffer member is in direct contact with the sealant and the protective layer.

3. The light emitting device of claim 1, wherein the inorganic oxide is selected from the group consisting of silicon dioxide, titanium dioxide, zinc oxide, zirconium dioxide, ferrite oxide, antimony oxide, phosphorous oxide, aluminum oxide, boron oxide, tungsten oxide, magnesium oxide, bismuth oxide, vanadium oxide, calcium oxide, barium oxide, lithium oxide, sodium oxide, potassium oxide, tellurium oxide, lead oxide, tin oxide, ruthenium oxide, rubidium oxide, rhodium oxide, and copper oxide.

4. The light emitting device of claim 1, wherein the inorganic oxide particles has a particle size ranging from about 10 nm to about 500 nm.

5. The light emitting device of claim 1, wherein the polymeric resin comprises a material selected from the group consisting of acrylic resin, epoxy resin and a combination thereof.

6. The light emitting device of claim 1, wherein the concentration of the inorganic oxide particle increases with a distance from an interface between the protective layer and the buffer member.

7. The light emitting device of claim 1, wherein the first coefficient ranges from about $70 \times 10^{-6}$/K to about $300 \times 10^{-6}$/K.

8. The light emitting device of claim 1, wherein the second coefficient ranges from about $1 \times 10^{-6}$/K to about $300 \times 10^{-6}$/K.

9. The light emitting device of claim 1, wherein the third coefficient ranges from about $1 \times 10^{-6}$/K to about $10 \times 10^{-6}$/K.

10. The light emitting device of claim 1, wherein the illuminating member is an organic light emitting element, a polymeric light emitting element or a phosphor layer.

11. The light emitting device of claim 1, wherein the protective layer comprises a material selected from the group consisting of acrylic resin, epoxy resin and a combination thereof.

12. The light emitting device of claim 1, wherein the sealant comprises at least one material selected from the group consisting of silicon dioxide ($SiO_2$), titanium oxide ($TiO_2$), zinc oxide ($ZnO$), zirconium dioxide ($ZrO_2$), ferrite oxide ($Fe_2O_3$), antimony oxide ($Sb_2O_3$), phosphorous oxide ($P_2O_5$), aluminum oxide ($Al_2O_3$), boron oxide ($B_2O_3$), tungsten oxide ($WO_3$), magnesium oxide ($MgO$), bismuth oxide ($Bi_2O_3$), vanadium oxide ($V_2O_5$), calcium oxide ($CaO$), barium oxide ($BaO$), lithium oxide ($Li_2O$), sodium oxide ($Na_2O$), potassium oxide ($K_2O$), tellurium oxide ($TeO_2$), lead oxide ($PbO$), tin oxide ($SnO$), ruthenium oxide ($Ru_2O$), rubidium oxide ($Rb_2O$), rhodium oxide ($Rh_2O$) and copper oxide ($CuO$).

13. The light emitting device of claim 1, wherein the second coefficient of thermal expansion decreases with a distance from the protective layer.

14. The light emitting device of claim 1, wherein the second coefficient of thermal expansion has a maximum value at an end portion adjacent to the protective layer.

15. The light emitting device of claim 1, wherein the sealant has a width of about 500 μm to about 1000 μm.

16. The light emitting device of claim 1, wherein the sealant has a thickness of about 8 μm to about 30 μm.

17. The light emitting device of claim 1, wherein the buffer member has a width ranging from about 100 μm to about 500 μm.

18. The light emitting device of claim 1, wherein the buffer member has a thickness of about 8 μm to about 30 μm.

* * * * *